US006664171B2

(12) United States Patent
Gonzalez et al.

(10) Patent No.: US 6,664,171 B2
(45) Date of Patent: *Dec. 16, 2003

(54) METHOD OF ALLOYING A SEMICONDUCTOR DEVICE

(75) Inventors: Fernando Gonzalez, Boise, ID (US); Thomas A. Figura, Boise, ID (US); J. Brett Rolfson, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 10/304,194

(22) Filed: Nov. 25, 2002

(65) Prior Publication Data

US 2003/0077913 A1 Apr. 24, 2003

Related U.S. Application Data

(63) Continuation of application No. 08/555,801, filed on Nov. 9, 1995, now Pat. No. 6,489,219.

(51) Int. Cl.[7] .............................................. H01L 21/324
(52) U.S. Cl. ........................ 438/475; 438/791; 438/795
(58) Field of Search ................................. 438/778, 475, 438/795, 798, 537, 586, 622, 143, 477, 953, 791

(56) References Cited

U.S. PATENT DOCUMENTS

| 3,849,204 A | | 11/1974 | Fowler ......................... 148/1.5 |
| 4,364,779 A | * | 12/1982 | Kamger et al. |
| 5,248,348 A | | 9/1993 | Miyachi et al. .............. 136/258 |
| 5,250,444 A | | 10/1993 | Khan et al. .................... 437/24 |
| 5,273,920 A | | 12/1993 | Kwasnick et al. ............ 437/40 |
| 5,304,509 A | | 4/1994 | Sopori ......................... 437/173 |
| 5,336,533 A | * | 8/1994 | Balmashnov et al. |
| 5,336,623 A | | 8/1994 | Sichanugrist et al. .......... 437/4 |
| 5,403,756 A | | 4/1995 | Yoshinouchi et al. ......... 437/24 |
| 5,425,843 A | | 6/1995 | Saul et al. ................ 156/643.1 |
| 5,516,731 A | * | 5/1996 | Toutounchi et al. |
| 5,543,336 A | | 8/1996 | Enami et al. .................. 437/24 |
| 5,674,759 A | * | 10/1997 | Jung |
| 5,923,964 A | * | 7/1999 | Li |

* cited by examiner

Primary Examiner—Savitri Mulpuri
(74) Attorney, Agent, or Firm—Workman Nydegger

(57) ABSTRACT

A method for alloying a semiconductor substrate upon which wordlines enclosed in spacers have been formed, with the substrate exposed between the wordlines. A thin sealing layer is deposited over the substrate and the wordlines, the sealing layer helping to maintain the alloy in said substrate. The alloying material employed in the substrate is hydrogen and optionally monatomic hydrogen. Alloying the substrate with monatomic hydrogen may also be done after deposition of a metal layer, or at other process steps as desired.

19 Claims, 2 Drawing Sheets

METHOD OF ALLOYING A SEMICONDUCTOR DEVICE

This application is a continuation of U.S. patent application Ser. No. 08/555,801, filed on Nov. 9, 1995, now U.S. Pat. No. 6,489,219 B1, which is incorporated herein by reference.

BACKGROUND OF THE INVENTION

1. The Field of the Invention

The present invention relates to the manufacture of semiconductor devices. More particularly, the present invention is directed to an improved method of alloying a semiconductor device during the manufacture thereof

2. The Relevant Technology

Hydrogen alloying, or annealing in a hydrogen atmosphere, is used to heal damage caused to the lattice structure of the crystalline semiconductor substrate by the various processes used to form circuit structures. Hydrogen, in the alloying process, forms bonds with damaged areas of the substrate, tying up dangling bonds of substrate atoms and improving the electrical properties of the substrate.

Hydrogen alloying is typically employed near the end of an integrated circuit fabrication procedure, after all circuit devices have been formed. Some typical structures present on a semiconductor substrate during such post-metal alloying are shown in cross section in FIG. 1.

FIG. 1 shows a partial cross section of a semiconductor device. Semiconductor substrate 12, typically a silicon substrate, has an isolation region 14, typically field oxide, which has been grown thereon. Wordlines 16 each enclosed in spacers 18 are formed over substrate 12 and isolation region 14. A thin etch-stop and sealing layer 20, typically silicon nitride, is present on substrate 12 and isolation region 14 except where plugs 24 contact substrate 12. Plugs 24 are formed of an electrically conductive material and extend from substrate 12 up through a first dielectric planarization layer 22. A capacitor structure including capacitor plate 26, thin dielectric layer 28, and capacitor plate/ground line 30 is formed in contact with one plug 24. In contact with the other plug 24 is a conductive-material via 34, typically formed of metal, which extends upward from the other plug 24 through a second dielectric planarization layer 32 to a conductive-material bitline 36, also typically formed of metal.

The typical hydrogen alloying step is performed upon structures identical to or similar to those shown in FIG. 1. Sealing layer 20 is relatively impervious to diffusion of various dopants, including hydrogen. Other structures formed on substrate 12 can also impede the diffusion of hydrogen somewhat. Thus, the path hydrogen must take to diffuse into substrate 12 typically takes the form of path P shown in FIG. 1. The hydrogen must typically pass through or around bitline 36, along via 34 and plug 24 and down into substrate 12 to alloy substrate 12 in region R. As circuit density in semiconductor devices increases, diffusion of hydrogen along path P of FIG. 1 becomes lengthy and more difficult, such that adequate hydrogen alloying of substrate 12 cannot be achieved. Thus an improved hydrogen alloying method is needed.

SUMMARY OF THE INVENTION

An object of the present invention is to provide a method of alloying a semiconductor device, said method providing adequate alloying even in highly dense devices.

Still another object of the present invention is to provide a rapid method of alloying a semiconductor device.

Still another object of the present invention is to provide a method of alloying a semiconductor device in situ with existing process steps.

In accordance with one preferred method of the present invention, alloying is performed upon a substrate on which wordlines enclosed in spacers have been formed, with the substrate exposed between the wordlines. A thin sealing layer is then deposited over the substrate and the wordlines, the sealing layer helping to maintain the hydrogen in the substrate. The hydrogen employed in alloying the substrate is optionally monatomic hydrogen.

According to another preferred method of the present invention, alloying is performed with monatomic hydrogen at a post-metal alloying step. Alloying with monatomic hydrogen may also be used at other process steps as desired.

Alloying while the substrate is still directly exposed can allow for a greater alloy concentration. The thin sealing layer deposited thereafter helps maintain the alloy concentration, such that subsequent damage to the substrate may be repaired in situ.

Alloying with monatomic hydrogen increases the diffusivity and reactivity of the hydrogen, allowing shorter process times and lower temperatures to achieve the same alloying effect.

These and other features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages of the invention are obtained may be more fully explained, a more particular description of the invention briefly described above will be rendered by reference to specific embodiments thereof which are illustrated in the appended drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION OF THE INVENTION

Figure 1:
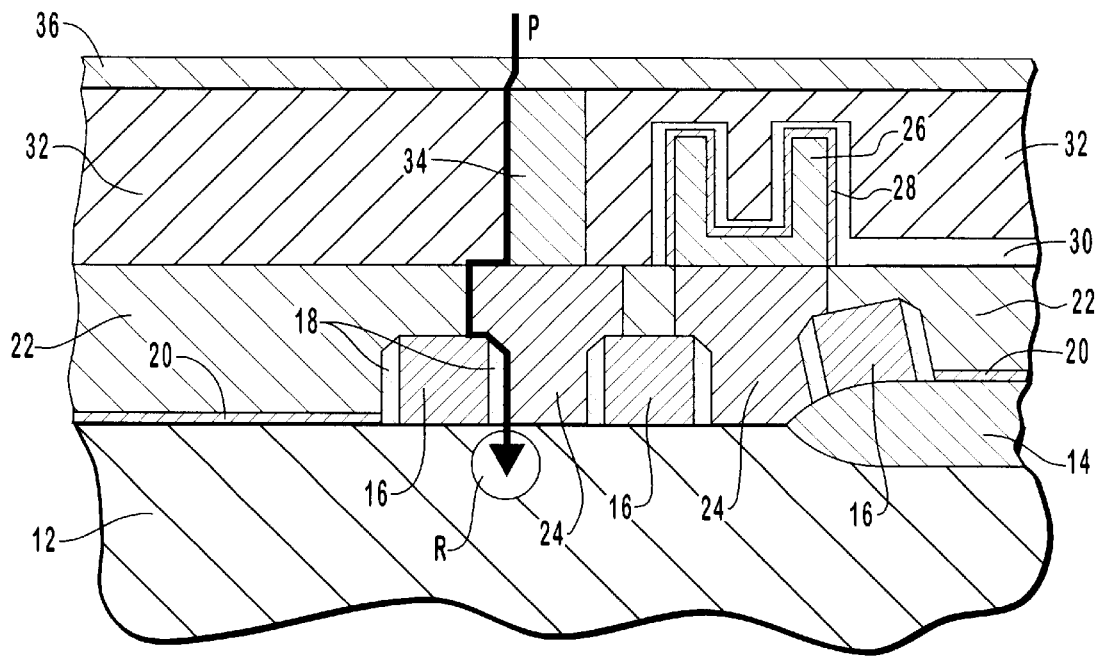
FIG. 1 is a partial cross section of a semiconductor device, showing the path P of hydrogen diffusion during post-metal alloying.

The present invention provides improved methods for alloying a semiconductor device, particularly the substrate thereof According to one preferred method of the present invention, the alloying is performed at an early step of the fabrication process, rather than post-metal as illustrated in FIG. 1. A post-metal alloying step may optionally be employed in addition to the earlier alloying step.

Figure 2:
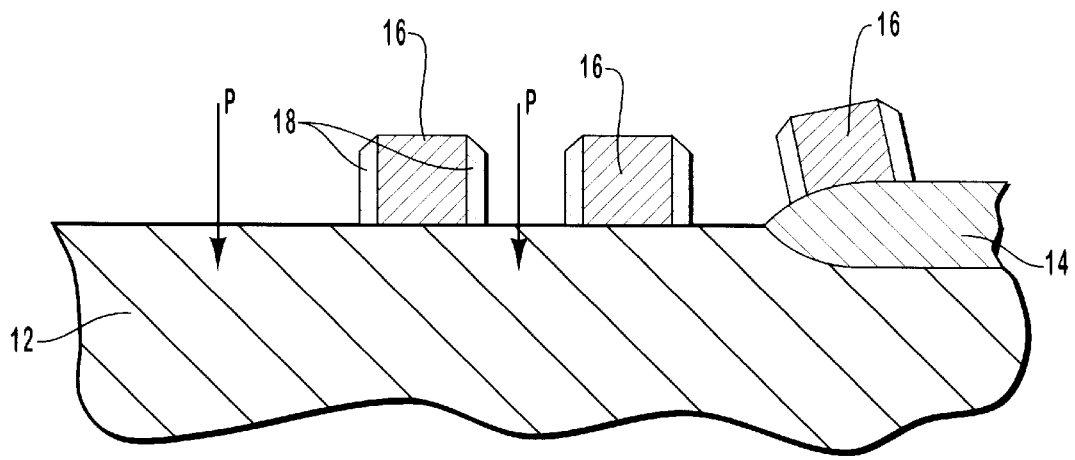
FIG. 2 is a partial cross section of a partially formed semiconductor device after formation of wordlines enclosed in spacers, showing the path P of hydrogen to a substrate according to one method of the present invention.

As shown in FIG. 2, at an earlier typical processing step, wordlines 16 enclosed in spacers 18 have been formed over substrate 12 and isolation region 14. Substrate 12 or isolation region 14 is exposed directly except at the locations of wordlines 16. According to a preferred method of the present invention, the semiconductor device is alloyed at the processing step represented in FIG. 2. The alloying material will preferably be hydrogen. The alloying material may also include, in addition to hydrogen, an inert gas and/or nitrogen. By way of example, the inert gas can be argon, helium, or a mixture of both. The alloying material, which has direct access to substrate 12, then travels path P of FIG. 2 to reach substrate 12.

Figure 3:
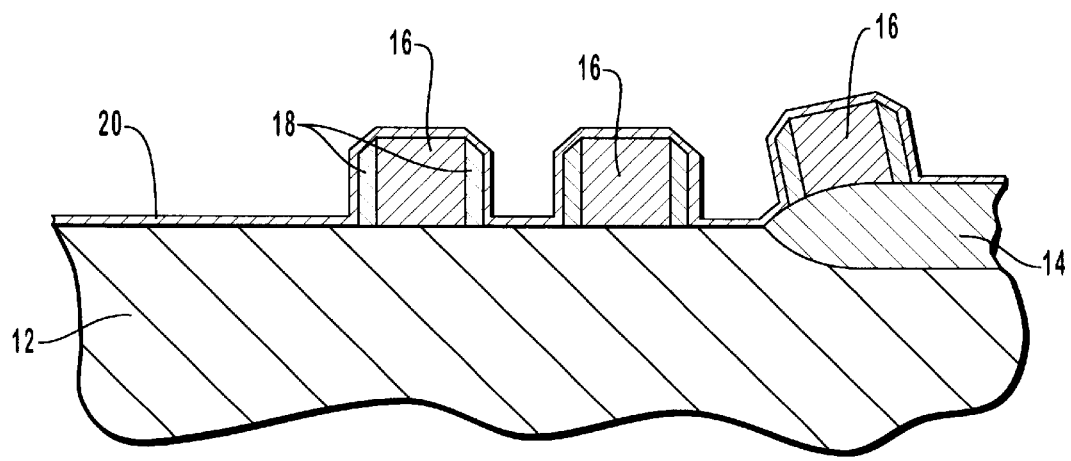
FIG. 3 shows the cross section of FIG. 2 after deposition of a thin sealing layer.

Immediately after alloying, a thin sealing layer 20, preferably silicon nitride but possibly alumina or layered nitride and oxide, is deposited over substrate 12 and all structures thereon, as shown in FIG. 3. Thin sealing layer 20 remains through subsequent processing in the semiconductor device over substantial areas of the substrate. This is seen in FIG. 1, where portions of thin sealing layer 20 remain. Thin sealing layer 20 is more impervious to the alloying material, helping to retain the alloying material in substrate 12. This allows the alloying material to remain in the substrate and repair substrate damage at later fabrication steps. The earlier alloying also assists in assuring sufficient total alloying after an optional post-metal alloying step.

Thin sealing layer 20 is already present in typical processing in the form of a thin nitride layer which serves as a diffusion barrier and an etch stop. Thus, the above preferred method of the present invention may be beneficially incorporated into the nitride deposition process. A standard nitride deposition chamber such as an LPCVD reactor or furnace may be used first to alloy the substrate in a hydrogen atmosphere at temperatures of preferably 400° C. or greater. The hydrogen is then evacuated, a vacuum drawn, and the typical LPCVD nitride deposition carried out. The preferred method is a plasma enhanced LPCVD. This in situ hydrogen alloying avoids adding process steps and provides maximum hydrogen content at the time the thin sealing layer of nitride is deposited.

Figure 4:
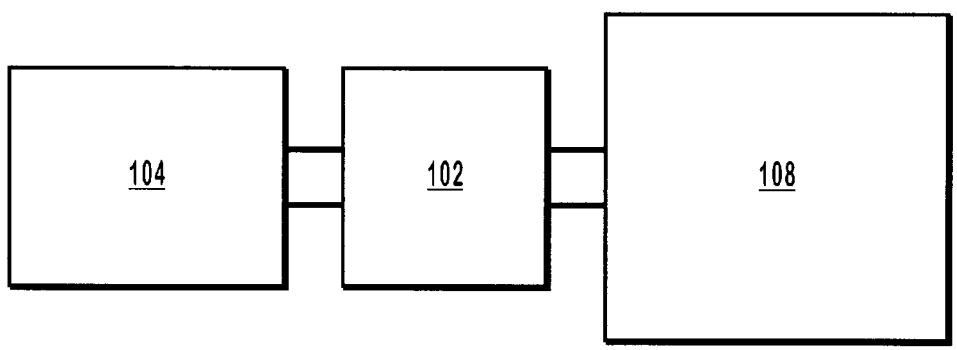
FIG. 4 is a schematic representation of some equipment useful in one method of the present invention.

According to another preferred method of the present invention, the semiconductor device is alloyed in an atmosphere substantially comprised of monatomic hydrogen instead of the typical diatomic hydrogen. Monatomic hydrogen may be provided as illustrated in FIG. 4 by passing hydrogen from a hydrogen source 104 through an energy source such as ionizer 102 and thence to a process chamber 108. Ionizer 102 may take many forms, including an ultraviolet light source, an RF generator, an electron beam ionizer, an ECR plasma generator, and the like. Alternatively, monatomic and ionized hydrogen may be created from diatomic hydrogen in the process chamber itself by an RF plasma or other typical means. Hydrogen ions may optionally be accelerated by a potential difference such as a biased substrate or substrate holder. Hydrogen ions may optionally also be guided, focussed, or filtered through the use of magnetic fields.

The use of monatomic hydrogen in this preferred method of the present invention has several benefits. Monatomic hydrogen presents a smaller cross section, diffusing more rapidly through the relatively long path P for post-metal anneal as shown in FIG. 1. Monatomic hydrogen is also more reactive than diatomic hydrogen, allowing the diffused hydrogen to more rapidly tie up dangling bonds in the substrate. This greater diffusivity and greater reactivity allow shorter processing times in furnace applications.

Monatomic hydrogen alloying may be used at post-metal alloying. Monatomic hydrogen alloying may also be used in conjunction with the first preferred method discussed above, early in the fabrication process just before depositing a thin layer of nitride. Monatomic hydrogen alloying may also be performed in situ before or after existing process steps, such as before the thin nitride deposition as discussed above, or after a dry etch in the same process chamber, or at any other process point at which substrate repair is needed.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method for alloying a semiconductor device, the method comprising:
   providing a semiconductor substrate with at least one electrical device formed thereon;
   alloying the semiconductor substrate through an exposed surface on the semiconductor substrate in an atmosphere comprising hydrogen; and
   forming, after the alloying and with no intervening fabrication step, a sealing layer comprising silicon nitride over the semiconductor substrate and the at least one electrical device, the sealing layer assisting in retaining in the semiconductor substrate the hydrogen introduced through the exposed surface on the semiconductor substrate.

2. The method of claim 1, wherein forming of the sealing layer is performed in situ after alloying the semiconductor substrate.

3. The method of claim 1, wherein the semiconductor substrate comprises a silicon substrate.

4. The method of claim 1, wherein alloying the semiconductor substrate comprises alloying the semiconductor substrate in an atmosphere comprising monatomic hydrogen.

5. The method of claim 4, wherein alloying the semiconductor substrate further comprises passing diatomic hydrogen through an ionizer to produce monatomic and ionized hydrogen.

6. The method of claim 5, wherein the ionizer comprises an ultraviolet light source.

7. The method of claim 5, wherein the ionizer comprises an RF source.

8. The method of claim 5, wherein the ionizer comprises an electron beam source.

9. The method of claim 5, wherein the ionizer comprises a plasma generator.

10. The method of claim 5, wherein alloying the semiconductor substrate further comprises accelerating the ionized hydrogen across a potential difference.

11. The method of claim 5, wherein alloying the semiconductor substrate further comprises guiding the ionized hydrogen in a magnetic field.

12. The method of claim 1, wherein the atmosphere further comprises an inert gas.

13. The method of claim 12, wherein the inert gas is selected from the group consisting of argon, helium, and a mixture thereof.

14. The method of claim 1, wherein the atmosphere further comprises nitrogen.

15. The method of claim 12, wherein the atmosphere further comprises nitrogen.

16. A method for alloying a semiconductor device, the method comprising:

providing a silicon substrate with at least one electrical device formed thereon;

alloying the silicon substrate through an exposed surface on the silicon substrate in an atmosphere comprising monatomic hydrogen; and forming, after alloying and with no intervening fabrication step, a sealing layer comprising silicon nitride over the silicon substrate and the at least one electrical device, the sealing layer assisting in retaining in the silicon substrate the monatomic hydrogen introduced through the exposed surface on the silicon substrate.

17. The method of claim 16, wherein alloying the semiconductor substrate further comprises passing diatomic hydrogen through an ionizer to produce monatomic and ionized hydrogen.

18. The method of claim 17, wherein alloying the semiconductor substrate further comprises accelerating the ionized hydrogen across a potential difference.

19. The method of claim 17, wherein alloying the semiconductor substrate further comprises guiding the ionized hydrogen in a magnetic field.

* * * * *